United States Patent [19]

Koyama

[11] Patent Number: 5,894,226
[45] Date of Patent: Apr. 13, 1999

[54] IC TESTING APPARATUS

[75] Inventor: Jo Koyama, Tokyo, Japan

[73] Assignee: Ando Electric Co., Ltd, Tokyo, Japan

[21] Appl. No.: 08/864,453

[22] Filed: May 28, 1997

[30] Foreign Application Priority Data

May 30, 1996 [JP] Japan .................... 8-137201

[51] Int. Cl.$^6$ .................... G01R 31/26
[52] U.S. Cl. .................... 324/765; 324/158.1; 324/76.79; 371/1
[58] Field of Search .................... 324/765, 73.1, 324/158.1, 76.52, 76.62, 76.74, 76.79; 371/1; 375/371

[56] References Cited

U.S. PATENT DOCUMENTS

| | | | |
|---|---|---|---|
| 4,929,888 | 5/1990 | Yoshida | 324/158.1 X |
| 5,225,775 | 7/1993 | Sekino | 324/158.1 |
| 5,517,109 | 5/1996 | Albean et al. | 324/158.1 |

Primary Examiner—Glenn W. Brown
Attorney, Agent, or Firm—Finnegan, Henderson, Farabow, Garrett & Dunner, L.L.P.

[57] ABSTRACT

An IC testing apparatus performs testing on a test device such as an IC using test signals each consisting of test pulses. The apparatus contains skew adjusting circuits, drivers and comparators. Herein, the skew adjusting circuit receives a test signal to perform a skew adjustment. The driver converts an output of the skew adjusting circuit in voltage to match with the test device, so that an output signal of the driver is sent to the test device for the testing. The comparator compares an input signal thereof given from the test device with a reference value. Due to the provision of the drivers and comparators, there is the driver skew and comparator skew. A decision circuit is provided to make a decision as to whether the output of the skew adjusting circuit delays or advances from a decision strobe signal which synchronizes with the test signal, thus producing a decision signal. An amount of skew corrections is counted from the decision signal with a precision to create skew correction data. The skew adjusting circuits are controlled based on the skew correction data to perform the skew adjustment. By controlling the precision, it is possible to realize a high-precision skew adjustment on the test signals which contain jitters.

5 Claims, 4 Drawing Sheets

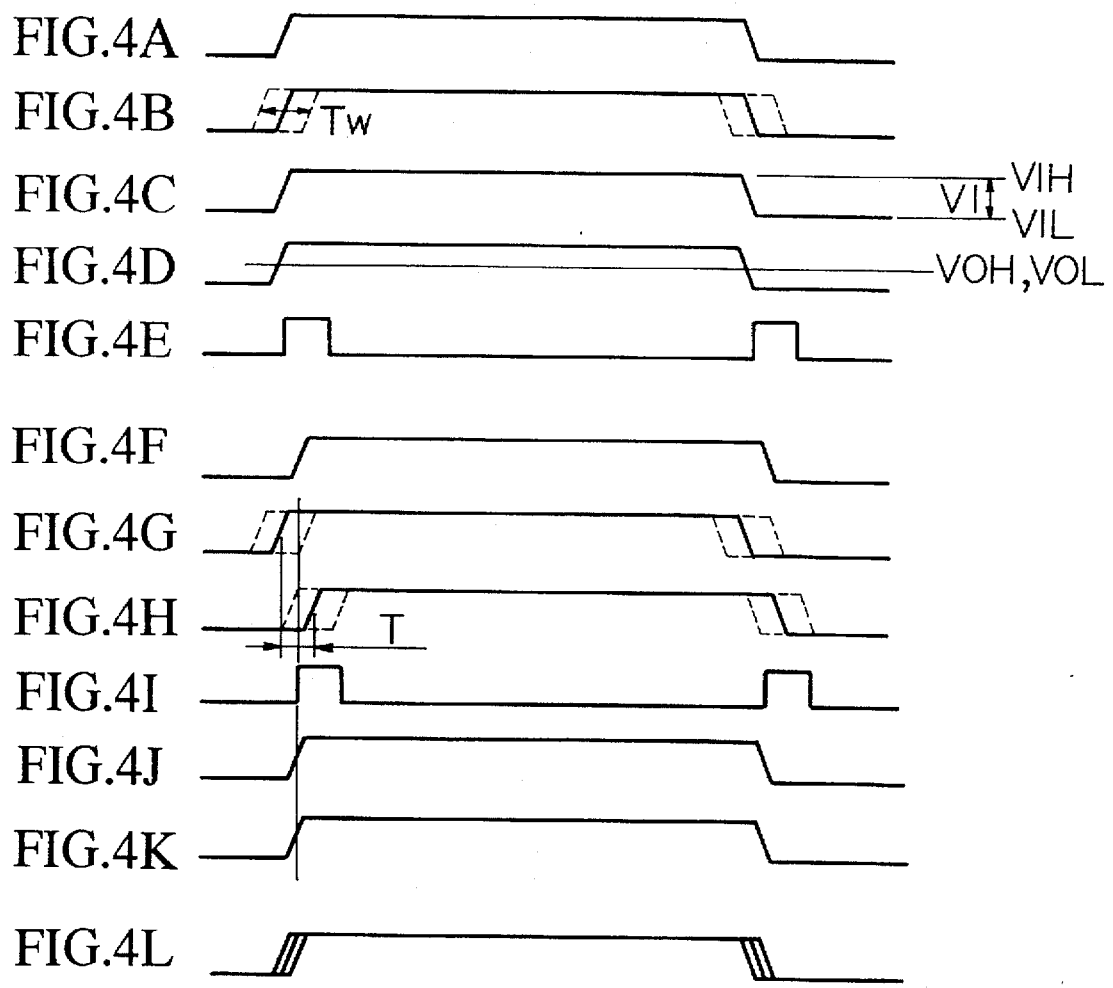

IC TESTING APPARATUS

BACKGROUND OF THE INVENTION

This invention relates to IC testing apparatuses which perform testing on test devices such as integrated circuits (ICs). Particularly, this invention relates to an IC testing apparatus which is capable of adjusting the skew (i.e., time delay) between signals transmitted with respect to test devices.

The skew occurs when transmitting these signals through multiple transmission systems. So, the skew indicates a shift deviated from expected values representing phases which occur between the signals or expected values representing amplitudes of the signals in time. There are 2 kinds of skews, i.e., a driver skew and a comparator skew. The driver skew occurs when a test signal applied to a test device passes through a driver. That is, the driver skew is caused to occur due to errors in characteristics of elements constructing the driver or errors of circuits constructing the driver. The comparator skew occurs when a receiving signal passes through a comparator. Herein, the receiving signal is a signal which is output from the test device and is input to the IC testing apparatus.

FIG. 3 is a block diagram showing an example of the IC testing apparatus. In FIG. 3, skew adjusting circuits 1-1 to 1-n and 2-1 to 2-n delay or advance 1-bit test signals d1 to dn and D1 to Dn respectively. Herein, a test signal forming circuit (not shown) is constructed based on skew correction data, the contents of which will be described later. Drivers 3-1 to 3-n and 4-1 to 4-n are connected in series with the skew adjusting circuits 1-1 to 1-n and 2-1 to 2-n respectively. The drivers convert the test signals to the voltage which matches with a test device.

Comparators 5-1 to 5-n are connected to follow outputs of the drivers 4-1 to 4-n respectively. Each of the comparators performs a comparison between an output signal of the test device and a reference value which is determined in advance on the basis of the voltage matching with the test device. If the output signal of the test device is higher than the reference value, the comparator provides an output of 'H' (i.e., a high-level output). Skew adjusting circuits 6-1 to 6-n are configured similar to the aforementioned skew adjusting circuits 1-1 to 1-n and 2-1 to 2-n, wherein they are connected to follow outputs of the comparators 5-1 to 5-n respectively. In addition, the skew adjusting circuits 6-1 to 6-n each receive skew correction data. On the basis of the skew correction data, the skew adjusting circuits 6-1 to 6-n delay or advance output signals of the comparators 5-1 to 5-n respectively.

The test device has multiple signal pins which contain an input pin and an input/output pin. Herein, the input pin is exclusively used for inputting of a signal, whilst the input/output pin is used for inputting and outputting of a signal. The drivers 3-1 to 3-n are connected to the input pin of the test device. The drivers 4-1 to 4-n and the comparators 5-1 to 5-n are connected to the input/output pin of the test device.

A skew multiplexer 10 has multiple lines of input/output terminals, disposed at a left side thereof, as well as a single line of input/output terminals positioned at a right side thereof. The multiple lines of input/output terminals of the skew multiplexer 10 are connected to follow outputs of the drivers 3-1 to 3-n and 4-1 to 4-n. In the skew multiplexer 10, connections are sequentially made between the multiple lines of input/output terminals and the single line of input/output terminals under the control of a central processing unit (i.e., CPU) 15, the content of which will be described later. A driver 11 is configured similarly to the aforementioned drivers 3-1 to 3-n and 4-1 to 4-n. Further, a comparator 12 is configured as similar to the aforementioned comparators 5-1 to 5-n. The single line of input/output terminals of the skew multiplexer 10 is connected to follow an output of the driver 11 as well as an input of the comparator 12.

A decision circuit 13 has two inputs and one output. Herein, a first input of the decision circuit 13 is connected to an output of the comparator 12. In addition, a second input of the decision circuit 13 receives a decision strobe signal which forms a reference in timing for driver signals applied to the test device. The decision strobe signal synchronizes with the test signals input to the skew adjusting circuits 1-1 to 1-n and 2-1 to 2-n. At a leading-edge timing of the decision strobe signal, the decision circuit 13 latches an output signal of the comparator 12 to make a decision on its timing. For example, if the output signal of the comparator 12 is in a high (H) level at the leading-edge timing of the decision strobe signal, the decision circuit 13 provides an output of 'H'. In contrast, if the output signal is in a low (L) level, the decision circuit 13 provides an output of 'L'. The output of the decision circuit 13 is called a decision signal which represents an event of 'pass' if it is 'L' or which represents an event of 'fail' (or failure) if it is 'H'. So, the output of the decision circuit 13 representing 'pass' or 'fail' is input to an OR circuit 14.

Next, decision circuits 9-1 to 9-n are connected to the skew adjusting circuits 6-1 to 6-n respectively. They are configured similar to the decision circuit 13 described above. So, outputs of the decision circuits 9-1 to 9-n representing 'pass' or 'fail' are input to the OR circuit 14. The CPU 15 calculates skew correction data based on an output of the OR circuit 14. The skew correction data controls the skew adjusting circuits 1-1 to 1-n, 2-1 to 2-n and 6-1 to 6-n. In addition, the CPU 15 stores the calculated skew correction data in a storage device (not shown) such as a hard-disk unit in a file form. As described before, the CPU 15 is provided to control the skew multiplexer 10. In addition, the CPU 15 performs an overall control on the apparatus as a whole. A skew register unit 16 contains registers which work for the skew adjusting circuits 1-1 to 1-n, 2-1 to 2-n and 6-1 to 6-n respectively. So, the calculated skew correction data are stored in each of the registers.

Next, a description will be given with respect to operations of the apparatus of FIG. 3, which adjusts the driver skew of the test signals applied to the test device, in conjunction with FIGS. 4A to 4L. FIGS. 4A to 4L are time charts representing waveshapes of signals monitored at certain portions of the IC testing apparatus of FIG. 3. The waveshape of FIG. 4A represents each of the test signals d1 to dn and D1 to Dn which are applied to the apparatus. Because of the functions of the skew adjusting circuits 1-1 to 1-n, 2-1 to 2-n, 6-1 to 6-n and the functions of the drivers 3-1 to 3-n, 4-1 to 4-n, the test signal originally represented by the waveshape of FIG. 4A is shifted in timing to form a waveshape of FIG. 4B. In response to the test signals, the drivers 3-1 to 3-n and 4-1 to 4-n provide output signals, each represented by a waveshape of FIG. 4C, whose voltage is converted to match with the test device. Incidentally, FIG. 4C shows an example of the waveshape, representing the output signal of the driver, which is not shifted from the original waveshape of the test signal shown in FIG. 4A.

Only one of the output signals of the drivers 3-1 to 3-n and 4-1 to 4-n is selected by the CPU 15 and is input to the comparator 12 via the skew multiplexer 10. For example, the output signal of the driver 3-1 is firstly selected and is input to the comparator 12; next, the output signal of the driver 3-2 is selected and is input to the comparator 12. The comparator 12 performs comparison between a predetermined reference value thereof and the selected output signal of the driver corresponding to the test signal. Then, a result of the comparison is forwarded to the decision circuit 13. So, the decision circuit 13 latches a value of an output signal of the comparator 12 at a leading-edge timing of the decision strobe signal having a waveshape shown in FIG. 4E. FIG. 4F shows a waveshape of the output signal of the comparator 12.

On the basis of the latched value of the output signal of the comparator 12, the decision circuit 13 produces a decision signal representing 'pass' or 'fail'. The decision signal is forwarded to the CPU 15 via the OR circuit 14. So, the CPU 15 makes a decision, based on the decision signal which is produced in response to the test signal (e.g., d1), as to whether or not the decision signal delays or advances from the decision strobe signal. If it advances, the CPU 15 calculates skew correction data to instruct 'delay'. If it delays, the CPU 15 calculates skew correction data to instruct 'advance'.

The calculated skew correction data are stored in the storage device in the file form and are forwarded to the corresponding register of the skew register unit 16. So, the skew adjusting circuit 1-1 sets a delay time or an advance time (see FIGS. 4G and 4H) based on the skew correction data stored in the corresponding register of the skew register unit 16. Thereafter, the CPU 15 gradually changes the skew correction data which are forwarded to the skew register unit 16. Such a gradual change of the skew correction data is continuously made until a transition occurs from 'pass' to 'fail' (or from 'fail' to 'pass') with respect to the decision signal which the decision circuit 13 outputs in response to the selected test signal (i.e., output signal of the selected driver). Such an operation is called a 'binary search'. A point of the transition corresponds to a leading-edge timing of a decision strobe signal shown in FIG. 4I. So, the test signals should be matched with the above timing.

After completion of the binary search which the CPU 15 performs with respect to the selected test signal, the CPU 15 issues an instruction to the skew multiplexer 10 to select another test signal. Based on the instruction, the skew multiplexer 10 newly selects a test signal. So, the CPU 15 performs a binary search on the test signal newly selected. Thus, it is possible to adjust the test signal in timing. As described heretofore, the CPU 15 performs the binary search on all of the test signals d1 to dn and D1 to Dn, thus adjusting them in timings.

As a result, all the test signals (i.e., output signals of the drivers 3-1 to 3-n and 4-1 to 4-n) correspond with each other in timings. Thus, it is possible to obtain the test signals which do not have shifts in the skew (see FIGS. 4I and 4K). The CPU 15 obtains final results of the calculations for providing the skew correction data which are forwarded to the skew adjusting circuits 1-1 to 1-n and 2-1 to 2-n to provide the test signals without shifts in the skew. The final results of the skew correction data are stored in the skew register unit 16 and are also stored in the storage unit in the file form. The above process is sequentially performed on the test signals (i.e., output signals of the drivers 3-1 to 3-n and 4-1 to 4-n).

Next, a description will be given with respect to operations to adjust the comparator skew. As described before, the comparator skew occurs when the receiving signal, which is outputted from the test device and is input to the IC testing apparatus, passes through the comparator. At first, a skew adjustment reference signal, which simulates the aforementioned test signal shown in FIG. 4A, is input to the driver 11. The driver 11 converts the skew adjustment reference signal in voltage to match with the test device. So, the skew adjustment reference signal whose voltage is converted to match with the test device is applied to the single line of input/output terminals of the skew multiplexer 10. Under the control of the CPU 15, the skew multiplexer 10 makes connections between the single line of input/output terminals and the multiple lines of input/output terminals respectively. For example, the single line of input/output terminals is firstly connected to the comparator 5-1 and is next connected to the comparator 5-2.

Suppose that the skew adjustment reference signal is input to the comparator 5-1 via the skew multiplexer 10. Herein, the comparator 5-1 compares the skew adjustment reference signal with a predetermined reference value (input thereto). Then, an output of the comparator 5-1 is forwarded to the skew adjusting circuit 6-1 wherein it is delayed or advanced. An output signal of the skew adjusting circuit 6-1 is forwarded to the decision circuit 9-1. The decision circuit 9-1 latches a value of the output signal of the skew adjusting circuit 6-1 at a certain timing of a decision strobe signal input thereto which synchronizes with the reference signal. So, the decision circuit 9-1 makes a decision of 'pass' or 'fail' on the latched value. Thus, the decision circuit 9-1 produces a decision signal representing 'pass' or 'fail', which is forwarded to the OR circuit 14. The CPU 15 calculates skew correction data based on the decision signal outputted from the decision circuit 9-1. The calculated skew correction data are stored in the storage device in the file form and are also stored in a register of the skew register unit 16 which corresponds to the skew adjusting circuit 6-1. So, the CPU 15 performs a binary search as described before. Such a binary search is sequentially performed with respect to outputs of the comparators 5-1 to 5-n. As described before, the skew adjustment reference signal is input to the comparators 5-1 to 5-n respectively at different timings; however, the CPU 15 controls the skew adjusting circuits 6-1 to 6-n to adjust timings to provide output signals. That is, the output signals are provided at a same timing.

The aforementioned example of the IC testing apparatus is designed to perform skew corrections by detecting a transition point of the test signal and skew adjustment reference signal with respect to the leading-edge timing of the decision strobe signal. In the actual measurement of the test device, the test signals d1 to dn and D1 to Dn are continuously provided and are input to the apparatus. So, there is a possibility that jitters occur due to shifts in timings of the signals as shown in FIG. 4L. If the jitters occur, the aforementioned example of the IC testing apparatus cannot specify a timing, within the jitters, to perform a skew correction. This greatly affects the precision of the test signals d1 to dn and D1 to Dn in timings. A frequency of the jitters becomes great with respect to high-frequency signals. In short, the IC testing apparatus suffers from a problem of the jitters.

SUMMARY OF THE INVENTION

It is an object of the invention to provide an IC testing apparatus which is capable of performing skew corrections with a high precision even if jitters occur in the test signals.

An IC testing apparatus of this invention performs testing on a test device such as an IC using test signals each consisting of test pulses. The apparatus contains skew adjusting circuits, drivers and comparators. Herein, the skew adjusting circuit receives a test signal to perform a skew adjustment. The driver converts an output of the skew adjusting circuit in voltage to match with the test device so that an output signal of the driver is sent to the test device for the testing. The comparator compares an input signal thereof given from the test device with a reference value. Due to provision of the drivers and comparators, there is the driver skew and comparator skew.

When adjusting the driver skew, a decision circuit makes a decision as to whether a test signal passing through the skew adjusting circuit and driver in series delays or advances from a decision strobe signal which synchronizes with the test signal, thus producing a decision signal.

When adjusting the comparator skew, a reference signal simulating the test signal is forwarded to the comparator wherein it is compared with a reference value. A decision circuit makes a decision as to whether an output of the comparator, which is transmitted thereto via the skew adjusting circuit, delays or advances from a decision strobe signal which synchronizes with the reference signal, thus producing a decision signal.

The apparatus of this invention is characterized by performing the skew adjustment with a desired precision which is actualized by a normal mode and a high-precision mode. In the normal mode, skew correction data are created directly based on the decision signal. In the high-precision mode, an amount of skew corrections is counted from the decision signal with a certain precision which can be determined in advance, thus creating skew correction data.

The skew adjusting circuits are controlled based on the skew correction data to perform the skew adjustment. By controlling the precision, it is possible to realize a high-precision skew adjustment on test signals which contain jitters.

BRIEF DESCRIPTION OF THE DRAWINGS

These and other objects of the subject invention will become more fully apparent as the following description is read in light of the attached drawings wherein:

FIGS. 4A to 4L show waveshapes of signals which are used to explain operations of the IC testing apparatus of FIG. 3.

DESCRIPTION OF THE PREFERRED EMBODIMENT

Figure 1:
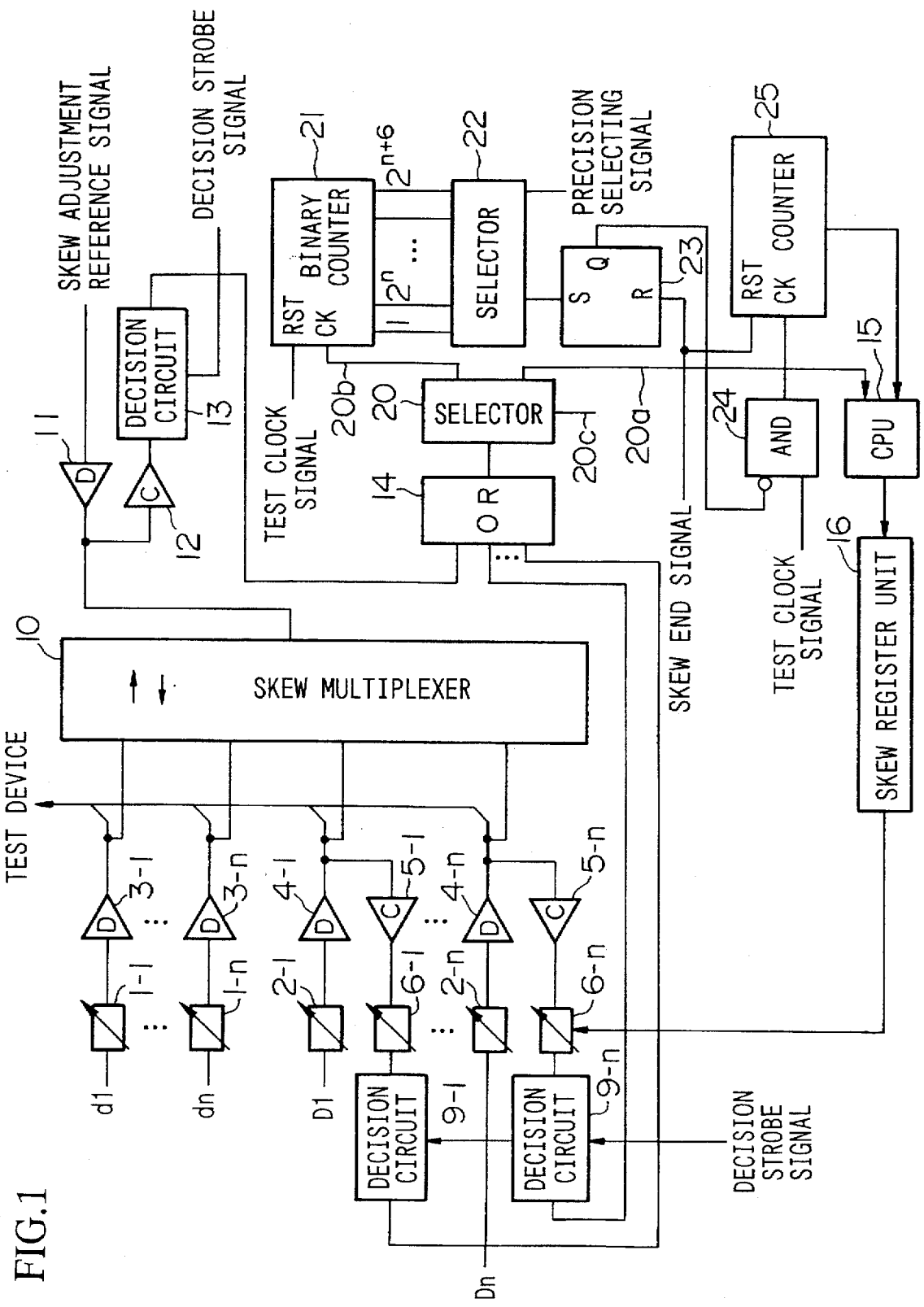
FIG. 1 is a block diagram showing an IC testing apparatus in accordance with an embodiment of the invention.

Now, a description will be given with respect to an IC testing apparatus, which is designed in accordance with an embodiment of the invention, in conjunction with FIG. 1. In FIG. 1, parts equivalent to those of FIG. 3 will be designated by the same numerals; hence, the description thereof will be omitted. In addition to the aforementioned parts of the IC testing apparatus of FIG. 3, the IC testing apparatus of FIG. 1 further provides parts 20 to 25 between the OR circuit 14 and the CPU 15. That is, the IC testing apparatus of FIG. 1 further contains a selector 20, a binary counter 21, a selector 22, an R-S flip-flop 23, an AND circuit 24 and a counter 25.

A main body of the IC testing apparatus is equipped with an adjustment-mode selecting button switch (not shown) which is manipulated to produce a mode selection signal. The mode selection signal is transmitted through a mode line 20c and is input to the selector 20. The mode selection signal selects either a normal mode or a high-precision mode. Herein, the normal mode is to perform a normal skew adjustment which is made by the aforementioned example of the IC testing apparatus, whilst the high-precision mode is to perform a high-precision skew adjustment which is made under the consideration of the jitters. When the normal mode is selected, an output signal of the OR circuit 14 passes through the selector 20, from which it is forwarded to the CPU 15 via a line 20a. That is, when the normal mode is selected, the IC testing apparatus of FIG. 1 acts like the aforementioned IC testing apparatus of FIG. 3. Herein, only the difference between them is intervention of the selector 20 between the OR circuit 14 and the CPU 15.

When the high-precision mode is selected to perform the high-precision skew adjustment under the consideration of the jitters, an output signal of the OR circuit 14 is input to the selector 20, from which it is forwarded to a clock input (CK) of the binary counter 21. The binary counter 21 performs a counting operation on signals input to the clock input thereof. Then, results of the counting operation are provided in the form of a binary code of multiple bits, which are provided as multiple outputs of the binary counter 21. The binary code of multiple bits are forwarded to the selector 22, which receives a precision selecting signal. Herein, the precision selecting signal designates a highest bit position defining a certain range of bits within the multiple bits of the binary code outputted from the binary counter 21. For example, the binary counter 21 is designed as a 7-bit counter which provides a binary code of 7 bits. In this case, the 7-bit binary code ranges between '0000000' and '1111111' whose decimal numbers are '0' and '127'. Suppose a situation where the precision selecting signal designates a highest bit position of the 7-bit binary code which represents $2^6$ in decimal notation. In this situation, if '1' appears at the highest bit position of the 7-bit binary code, in other words, if a decimal number of the 7-bit binary code is '64' or more, the selector 22 provides an output of 'H'.

The output of the selector 22 is forwarded to the R-S flip-flop 23. Herein, a skew end signal, whose content will be described later, is supplied to an input R of the R-S flip-flop 23. An output Q of the R-S flip-flop 23 is forwarded to a negated input of the AND circuit 24. So, an AND operation is performed on an inverted value of the output Q and a test clock signal whose content will be described later. A result of the AND operation is forwarded to a clock input (CK) of the counter 25. The counter 25 performs a counting operation on results of AND operations performed by the AND circuit 24. Then, a result of the counting operation is forwarded to the CPU 15.

Figure 2:
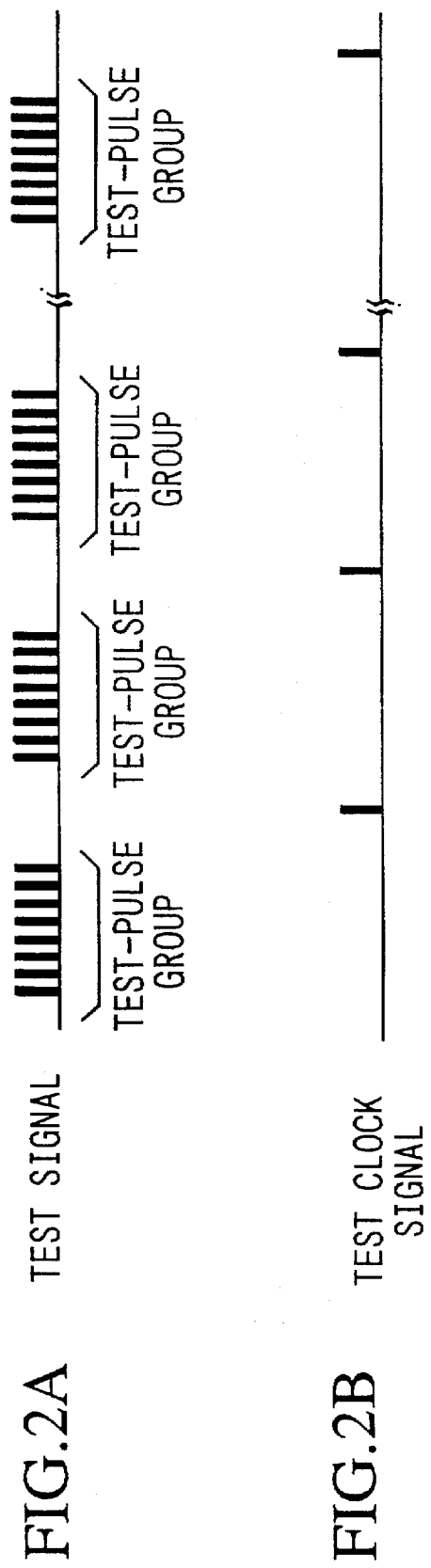
FIG. 2A is a time chart showing an example of a test signal.
FIG. 2B is a time chart showing an example of a test clock signal.

Next, a description will be given with respect to operations of the IC testing apparatus of FIG. 1 in the high-precision mode in conjunction with time charts of FIGS. 2A and 2B. Herein, FIG. 2A shows an example of a test signal, whilst FIG. 2B shows an example of a test clock signal. In the test signal of FIG. 2A, a group of test pulses (hereinafter, referred to as a test-pulse group) repeatedly appear by a certain period. One test-pulse group corresponds to a certain time. A number of patterns (i.e., a number of pulses) which appear in one test-pulse group is designated by 'np'. A number of times to repeat the test-pulse group is determined in response to a skew adjustment width, i.e., a time width (or time length) Tw shown in FIG. 4B. In the test clock signal of FIG. 2B, a pulse repeatedly appears at a certain period. Herein, a timing of the pulse is located at an intermediate timing between two test-pulse groups of the test signal of FIG. 2A.

In the present embodiment, '128' is set to the aforementioned number of patterns 'np', whilst 'np/2' (i.e., 64) is set to the precision selecting signal.

Suppose a situation where the CPU 15 selects one of the multiple lines of input/output terminals of the skew multiplexer 10 so that the driver 3-1 is connected to the single line of input/output terminals of the skew multiplexer 10.

In the above situation, the test signal of FIG. 2A is input to the skew adjusting circuit 1-1 wherein it is delayed or advanced by a certain time. Then, the delayed or advanced test signal is input to the driver 3-1 wherein it is converted in voltage to match with the test device. The converted test signal, outputted from the driver 3-1, is forwarded to the comparator 12 via the skew multiplexer 10. The comparator 12 compares it with the predetermined reference value. So, an output signal of the comparator 12 consists of pulses having a period which is identical to a period by which the test pulses appear in the test-pulse group of the test signal of FIG. 2A.

The output signal of the comparator 12 is forwarded to the decision circuit 13, which in turn produces a decision signal. The decision signal consists of pulses corresponding to the pulses of the output signal of the comparator 12 which are input to the decision circuit 13 after a leading-edge timing of the decision strobe signal. Based on the decision signal, it is possible to detect the leading-edge timing of the decision strobe signal as well as timings of the pulses which correspond to the test pulses. As described before, if the decision signal is high (H), the decision circuit 13 detects the event of 'fail'. So, a number of pulses each representing 'fail' (hereinafter, referred to as fail pulses) are continuously outputted as the decision signal after the leading-edge timing of the decision strobe signal.

The decision signal consisting of the fail pulses is transmitted onto the line 20b via the OR circuit 14 and the selector 20. So, the decision signal is forwarded to the clock input of the binary counter 21. The binary counter 21 counts a number of the fail pulses to provide a binary code. If the decimal number representing the binary code is smaller than the decimal number which is set to the precision selecting signal, the bit whose position is designated by the precision selecting signal is low (L). In that case, the R-S flip-flop 23 is not in a set state, so the output Q is low (L). If the output Q of the R-S flip-flop 23 is low, the AND circuit 24 is in an open state. After completion of inputting of one group of test pulses, a test clock pulse shown in FIG. 2B is input to the binary counter 21, so that results of counting of the binary counter 21 are cleared. This test clock pulse is also input to the AND circuit 24. If the R-S flip-flop 23 is not in a set state, the AND circuit 24 is in an open state. So, the counter 25 counts the test clock pulse which is forwarded thereto from the AND circuit 24.

Based on an output signal of the counter 25, the CPU 15 produces skew correction data representing an instruction to advance the test signal. Herein, the test signal is advanced from an initial state thereof by a predetermined time. The skew correction data are sent to a register, corresponding to the skew adjusting circuit 1-1, within the registers of the skew register unit 16. So, the skew adjusting circuit 1-1 operates based on the skew correction data to advance the test signal by the predetermined time. The 'advanced' test signal is transmitted through the driver 3-1 and the skew multiplexer 10 to reach the comparator 12, from which it is forwarded to the decision circuit 13. Thus, the decision circuit 13 produces an 'advanced' decision signal on the basis of the advanced test signal. The advanced decision signal passes through the OR circuit 14 and the selector 20 to reach the binary counter 21. A number of fail pulses contained in the advanced decision signal, input to the binary counter 21, corresponds to an advance time which the advanced test signal advances from the decision strobe signal.

If the number of the fail pulses which the binary counter 21 counts is smaller than the decimal number set to the precision selecting signal, the R-S flip-flop 23 is not in a set state. Thus, the counter 25 counts a number of test clock pulses inputted thereto through the AND circuit 24. On the basis of a count number of the counter 25, the CPU 15 advances the test signal from its initial state.

In short, the apparatus performs a binary search as described above. Through the binary search, if the number of the fail pulses which the binary counter 21 counts becomes equal to or greater than the decimal number set to the precision selecting signal, the R-S flip-flop 23 is put in a set state, so that the AND circuit 24 is put in a closed state. In the closed state, the AND circuit 24 blocks the test clock pulses to be forwarded to the counter 25. As a result, the counter 25 continuously outputs a same count value until all groups of test pulses are completely inputted to the apparatus.

Thereafter, the CPU 15 stores the count value of the counter 25 in the storage device in the file form. A skew end signal is issued to reset the R-S flip-flop 23 and the counter 25. Then, the CPU 15 controls the skew multiplexer 10 to transmit the test signal d2 to the comparator 12. So, the apparatus repeats the aforementioned operations on the test signal d2. After that, the apparatus performs the operations sequentially on the test signals which follow the test signal d2.

In order to adjust the comparator skew with respect to the comparators 5-1 to 5-n, the skew adjustment reference signal similar to the aforementioned test signal of FIG. 2A is input to the driver 11. So, the apparatus performs operations, equivalent to the aforementioned binary search, to realize the adjustment of the comparator skew.

Figure 3:
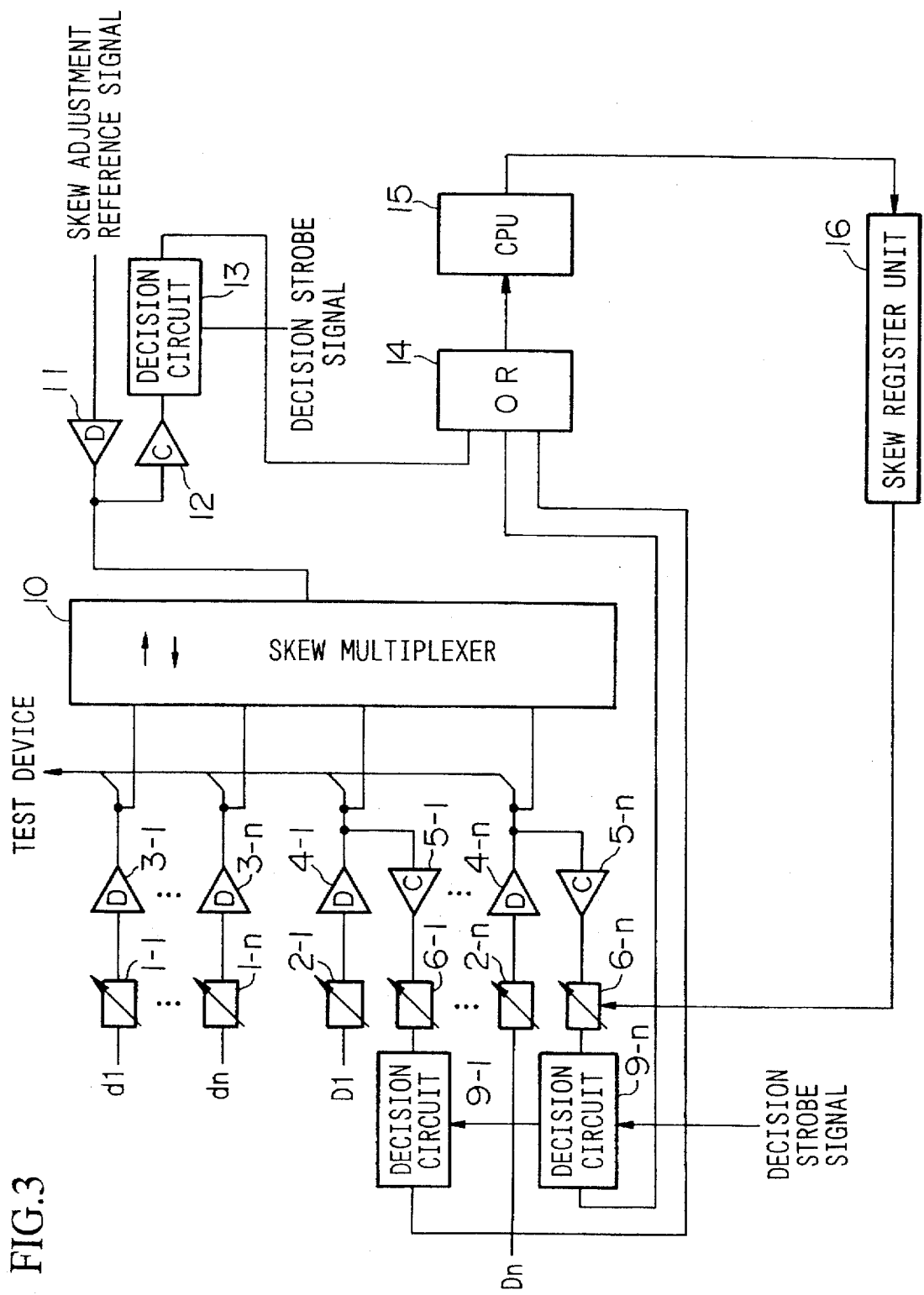
FIG. 3 is a block diagram showing an example of the IC testing apparatus which is used as the basis for designing the IC testing apparatus of FIG. 1.

Lastly, parts constructing the IC testing apparatus are not limited to those shown in FIGS. 1 and 3. For example, the selector 22 can be replaced with a comparator. In this case, a register is provided prior to the comparator to store data given from the CPU 15. So, the comparator compares the outputs of the binary counter 21 with the data. Thus, it is possible to provide a variety of conditions for placing the R-S flip-flop in a set state.

As described heretofore, the IC testing apparatus of the present embodiment is designed to provide the normal mode and high-precision mode, which are changed over on demand. Herein, the normal mode is used to perform the skew adjustment on the test signals without jitters, whilst the high-precision mode is used to perform the skew adjustment on the test signals with jitters. So, it is possible to widely use this invention in a variety of fields.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. An IC testing apparatus comprising:

at least two skew adjusting means, each of which performs a skew adjustment on a test signal input thereto;

selecting means for selecting one of the at least two skew adjusting means, so that the selecting means provides an adjusted test signal outputted from the selected skew adjusting means;

decision means for performing a decision as to a timing relationship between the adjusted test signal outputted from the selected skew adjusting means and a decision strobe signal which synchronizes with the test signal;

comparison means for performing a comparison between a result of the decision and a precision selecting signal representing a precision to detect the timing relationship; and control means for controlling the selected skew adjusting means on the basis of a result of the comparison to delay or advance the test signal.

2. An IC testing apparatus as defined in claim 1 further comprising:

reference signal generating means for generating a reference signal which simulates the test signal;

timing adjusting means, which is connected to the skew adjusting means in parallel, for performing a timing adjustment on the reference signal which is transmitted thereto via the selecting means, so that the timing adjusting means provides an adjusted reference signal; and timing decision means for performing a decision as to a timing relationship between the adjusted reference signal outputted from the timing adjusting means and a strobe signal which synchronizes with the reference signal, wherein the comparison means performs a comparison between a result of the decision performed by the timing decision means and the precision selecting signal, so that the control means controls the timing adjusting means on the basis of a result of the comparison to delay or advance the reference signal.

3. An IC testing apparatus as defined in claim 1 wherein the selecting means is configured by a multiplexer.

4. An IC testing apparatus, which performs testing on a test device using test signals each consisting of test pulses, comprising:

first series circuit means which consists of a skew adjusting circuit receiving a test signal and a driver, wherein the driver converts an output signal of the skew adjusting circuit in voltage to match with the test device, so that an output signal of the driver is sent to the test device;

second series circuit means which is connected in parallel with the first series circuit means, wherein the second series circuit means consists of a comparator for comparing an input signal thereof given from the test device with a reference value and a skew adjusting circuit receiving an output signal of the comparator;

first decision means for making a decision as to whether an output of the first series circuit means delays or advances from a first decision strobe signal which synchronizes with the test signal, thus producing a first decision signal;

reference signal generating means for generating a reference signal which simulates the test signal;

second decision means, coupled with the second circuit means in series, for making a decision as to whether an output of the second series circuit means delays or advances from a second decision strobe signal which synchronizes with the reference signal, thus producing a second decision signal;

multiplexer means for changing over connections thereof in such a way that when adjusting a driver skew, an output of the first series circuit means is transmitted to the first decision means, whilst when adjusting a comparator skew, the reference signal outputted from the reference signal generating means is transmitted to the second series circuit means;

skew counting means for counting an amount of skew corrections based on the first decision signal and/or the second decision signal with a precision which is designated in advance, thus creating skew correction data; and control means for controlling the first series circuit means and/or the second series circuit means to adjust the driver skew and/or the comparator skew on the basis of the skew correction data.

5. An IC testing apparatus as defined in claim 4 wherein the skew counting means operates in response to a normal mode and a high-precision mode respectively, so that in the normal mode, the skew counting means creates the skew correction data directly based on the first decision signal and/or the second decision signal, whilst in the high-precision mode, the skew counting means creates the skew correction data with the precision which is designated in advance.

* * * * *